(12) United States Patent
Bovatsek et al.

(10) Patent No.: US 9,751,154 B2
(45) Date of Patent: *Sep. 5, 2017

(54) TRANSPARENT MATERIAL PROCESSING WITH AN ULTRASHORT PULSE LASER

(71) Applicant: IMRA AMERICA, INC., Ann Arbor, MI (US)

(72) Inventors: James Bovatsek, San Jose, CA (US); Alan Y. Arai, Fremont, CA (US); Fumiyo Yoshino, Portland, OR (US)

(73) Assignee: IMRA AMERICA, INC., Ann Arbor, MI (US)

( * ) Notice: Subject to any disclaimer, the term of this patent is extended or adjusted under 35 U.S.C. 154(b) by 719 days.

This patent is subject to a terminal disclaimer.

(21) Appl. No.: 13/975,990

(22) Filed: Aug. 26, 2013

(65) Prior Publication Data

US 2014/0004318 A1 Jan. 2, 2014

Related U.S. Application Data

(63) Continuation of application No. 12/571,598, filed on Oct. 1, 2009, now Pat. No. 8,530,786, which is a (Continued)

(51) Int. Cl.
*B23K 26/40* (2014.01)
*B23K 26/53* (2014.01)
(Continued)

(52) U.S. Cl.
CPC ...... *B23K 26/0057* (2013.01); *B23K 26/0617* (2013.01); *B23K 26/0624* (2015.10);
(Continued)

(58) Field of Classification Search
CPC .......... B23K 236/0057; B23K 26/0617; B23K 26/0624; B23K 26/244; B23K 26/364; B23K 26/40; B23K 26/53

See application file for complete search history.

(56) References Cited

U.S. PATENT DOCUMENTS

| 4,424,435 A | 1/1984 | Barnes, Jr. |
| 5,230,184 A | 7/1993 | Bukhman |
| (Continued) | | |

FOREIGN PATENT DOCUMENTS

| DE | 19846368 C1 | 4/2000 |
| JP | 2000005892 A | 1/2000 |
| (Continued) | | |

OTHER PUBLICATIONS

Machine translation of Japan Patent document No. 2002-87,834-A.*

(Continued)

*Primary Examiner* — Geoffrey S Evans
(74) *Attorney, Agent, or Firm* — Sughrue Mion, PLLC; Richard C. Turner

(57) ABSTRACT

Methods for ultrashort pulse laser processing of optically transparent materials. A method for scribing transparent materials uses ultrashort laser pulses to create multiple scribe features with a single pass of the laser beam across the material, with at least one of the scribe features being formed below the surface of the material. This enables clean breaking of transparent materials at a higher speed than conventional techniques. Slightly modifying the ultrashort pulse laser processing conditions produces sub-surface marks. When properly arranged, these marks are clearly visible with side-illumination and not clearly visible without side-illumination. In addition, a method for welding transparent materials uses ultrashort laser pulses to create a bond through localized heating. The ultrashort pulse duration causes nonlinear absorption of the laser radiation, and the high repetition rate of the laser causes pulse-to-pulse accumulation of heat within the materials. The laser is focused near the interface of the materials, generating a high energy (Continued)

fluence at the region to be welded. This minimizes damage to the rest of the material and enables fine weld lines.

15 Claims, 10 Drawing Sheets

Related U.S. Application Data continuation of application No. 11/517,325, filed on Sep. 8, 2006, now Pat. No. 7,626,138.

(60) Provisional application No. 60/714,863, filed on Sep. 8, 2005.

(51) Int. Cl.
```
B23K 26/00      (2014.01)
B23K 26/06      (2014.01)
B28D 5/00       (2006.01)
B29C 65/00      (2006.01)
C03B 23/20      (2006.01)
C03B 23/203     (2006.01)
B29C 65/14      (2006.01)
B81B 1/00       (2006.01)
B29C 59/16      (2006.01)
C03B 33/02      (2006.01)
B23K 26/364     (2014.01)
B23K 26/244     (2014.01)
B23K 26/0622    (2014.01)
B29C 65/16      (2006.01)
B29C 65/38      (2006.01)
B29K 33/00      (2006.01)
B29K 69/00      (2006.01)
B23K 103/00     (2006.01)
```

(52) U.S. Cl.
CPC ......... *B23K 26/244* (2015.10); *B23K 26/364* (2015.10); *B23K 26/40* (2013.01); *B28D 5/0011* (2013.01); *B29C 59/16* (2013.01); *B29C 65/14* (2013.01); *B29C 65/1635* (2013.01); *B29C 65/1658* (2013.01); *B29C 66/1122* (2013.01); *B29C 66/3282* (2013.01); *B29C 66/41* (2013.01); *B29C 66/43* (2013.01); *B29C 66/73366* (2013.01); *B29C 66/73921* (2013.01); *B29C 66/836* (2013.01); *B29C 66/91641* (2013.01); *B29C 66/934* (2013.01); *B81B 1/00* (2013.01); *C03B 23/20* (2013.01); *C03B 23/203* (2013.01); *C03B 33/0222* (2013.01); *B23K 2203/50* (2015.10); *B29C 65/1616* (2013.01); *B29C 65/1638* (2013.01); *B29C 65/1664* (2013.01); *B29C 65/1674* (2013.01); *B29C 65/1696* (2013.01); *B29C 65/38* (2013.01); *B29C 66/30223* (2013.01); *B29C 66/322* (2013.01); *B29C 66/71* (2013.01); *B29C 66/7352* (2013.01); *B29C 66/919* (2013.01); *B29C 66/939* (2013.01); *B29C 66/944* (2013.01); *B29C 66/949* (2013.01); *B29K 2033/12* (2013.01); *B29K 2069/00* (2013.01); *B29K 2995/0026* (2013.01); *Y10T 428/13* (2015.01); *Y10T 428/15* (2015.01); *Y10T 428/24479* (2015.01); *Y10T 428/24802* (2015.01)

(56) References Cited

U.S. PATENT DOCUMENTS

| | | |
|---|---|---|
| 5,251,003 A | 10/1993 | Vigouroux |
| 5,304,357 A | 4/1994 | Sato |
| 5,543,365 A | 8/1996 | Wills |
| 5,580,473 A | 12/1996 | Shinohara |
| 5,609,284 A | 3/1997 | Kondratenko |
| 5,637,244 A | 6/1997 | Erokhin |
| 5,641,416 A | 6/1997 | Chadha |
| 5,744,780 A | 4/1998 | Chang |
| 5,814,532 A | 9/1998 | Ichihara |
| 5,826,772 A | 10/1998 | Ariglio |
| 5,840,147 A | 11/1998 | Grimm |
| 5,841,543 A | 11/1998 | Guldi |
| 5,843,265 A | 12/1998 | Grimm |
| 5,916,460 A | 6/1999 | Imoto et al. |
| 5,925,271 A | 7/1999 | Pollack |
| 5,976,392 A | 11/1999 | Chen |
| 6,031,201 A | 2/2000 | Amako |
| 6,121,118 A | 9/2000 | Jin |
| 6,181,728 B1 | 1/2001 | Cordingley |
| 6,211,488 B1 | 4/2001 | Hoekstra |
| 6,257,224 B1 | 7/2001 | Yoshino |
| 6,259,058 B1 | 7/2001 | Hoekstra |
| 6,285,002 B1 | 9/2001 | Ngoi |
| 6,322,958 B1 | 11/2001 | Hayashi |
| 6,325,855 B1 | 12/2001 | Sillmon |
| 6,333,486 B1 | 12/2001 | Troitski |
| 6,399,463 B1 | 6/2002 | Glenn et al. |
| 6,407,360 B1 | 6/2002 | Choo |
| 6,417,481 B2 | 7/2002 | Chen et al. |
| 6,420,678 B1 | 7/2002 | Hoekstra |
| 6,444,946 B1 | 9/2002 | Korte |
| 6,472,295 B1 | 10/2002 | Morris |
| 6,501,044 B1 | 12/2002 | Klockhaus et al. |
| 6,501,499 B2 * | 12/2002 | Hayashi ............ B23K 26/0057 347/224 |
| 6,509,548 B1 | 1/2003 | Troitski |
| 6,552,301 B2 | 4/2003 | Herman et al. |
| 6,565,248 B2 | 5/2003 | Honguh et al. |
| 6,576,863 B1 | 6/2003 | Piltch et al. |
| 6,587,136 B2 * | 7/2003 | Hayashi ............ B23K 26/0057 219/121.6 |
| 6,653,210 B2 | 11/2003 | Choo et al. |
| 6,656,315 B2 | 12/2003 | Sallavanti et al. |
| 6,663,297 B1 | 12/2003 | Goldstein |
| 6,670,576 B2 | 12/2003 | Troitski et al. |
| 6,734,389 B2 | 5/2004 | Troitski |
| 6,737,606 B2 | 5/2004 | Peng et al. |
| 6,744,009 B1 | 6/2004 | Xuan |
| 6,759,458 B2 | 7/2004 | Reil |
| 6,770,544 B2 | 8/2004 | Sawada |
| 6,787,732 B1 | 9/2004 | Xuan |
| 6,804,439 B1 | 10/2004 | Pregitzer |
| 6,838,156 B1 | 1/2005 | Neyer et al. |
| 6,911,262 B2 | 6/2005 | Sallavanti et al. |
| 6,992,026 B2 | 1/2006 | Fukuyo |
| 7,060,933 B2 | 6/2006 | Burrowes et al. |
| 7,538,048 B2 | 5/2009 | Kobayashi |
| 7,626,138 B2 * | 12/2009 | Bovatsek ........... B23K 26/0617 219/121.68 |
| 7,848,462 B2 | 12/2010 | Park et al. |
| 8,247,731 B2 | 8/2012 | Alexander |
| 8,314,359 B2 | 11/2012 | Bovatsek |
| 8,389,891 B2 | 3/2013 | Bovatsek |
| 8,530,786 B2 * | 9/2013 | Bovatsek ........... B23K 26/0617 219/121.68 |
| 9,138,913 B2 | 9/2015 | Arai |
| 2001/0031115 A1 | 10/2001 | Chen et al. |
| 2001/0035401 A1 | 11/2001 | Manor |
| 2002/0041323 A1 * | 4/2002 | Hayashi ............... B41M 5/262 347/224 |
| 2002/0115235 A1 | 8/2002 | Sawada |
| 2002/0162360 A1 | 11/2002 | Schaffer |
| 2004/0226925 A1 | 11/2004 | Gu |
| 2004/0228004 A1 | 11/2004 | Sercel |
| 2005/0046792 A1 * | 3/2005 | Ito ..................... B23K 26/04 351/159.75 |
| 2005/0145607 A1 | 7/2005 | Troitski et al. |
| 2005/0173387 A1 | 8/2005 | Fukuyo |
| 2005/0181581 A1 | 8/2005 | Fukuyo |
| 2005/0184037 A1 | 8/2005 | Fukuyo |
| 2005/0189330 A1 | 9/2005 | Fukuyo |

(56) References Cited

U.S. PATENT DOCUMENTS

| | | |
|---|---|---|
| 2005/0194364 A1 | 9/2005 | Fukuyo |
| 2005/0199599 A1 | 9/2005 | Li et al. |
| 2006/0000814 A1 | 1/2006 | Gu |
| 2006/0021978 A1 | 2/2006 | Alexeev |
| 2006/0040473 A1 | 2/2006 | Fukuyo |
| 2006/0091124 A1* | 5/2006 | Troitski ............ B23K 26/0054 219/121.69 |
| 2006/0113287 A1 | 6/2006 | Inada et al. |
| 2006/0160331 A1 | 7/2006 | Fukuyo |
| 2007/0051706 A1 | 3/2007 | Bovatsek |
| 2007/0086822 A1* | 4/2007 | Sato ................... B23K 26/0643 400/129 |
| 2007/0199927 A1 | 8/2007 | Gu |
| 2013/0095260 A1 | 4/2013 | Bovatsek |
| 2013/0183474 A1 | 7/2013 | Bovatsek |
| 2016/0067822 A1 | 3/2016 | Arai |

FOREIGN PATENT DOCUMENTS

| | | | |
|---|---|---|---|
| JP | 2002-87834 A | * | 3/2002 |
| JP | 2002-87834 A | | 3/2002 |
| JP | 2002087834 A | | 3/2002 |
| JP | 2003-340588 A | | 12/2003 |
| JP | 2004-223586 A | | 8/2004 |
| JP | 2004337902 A | | 12/2004 |
| JP | 2005021964 A | | 1/2005 |
| JP | 2005066629 A | | 3/2005 |
| JP | 2005109322 A | | 4/2005 |
| JP | 2006007619 A | | 1/2006 |
| JP | 2006-68762 A | | 3/2006 |
| JP | 2006088199 A | | 4/2006 |
| JP | 2006150385 A | | 6/2006 |
| JP | 2006159747 A | | 6/2006 |
| JP | 2006175487 A | | 7/2006 |
| JP | 2006320938 A | | 11/2006 |
| JP | 2007075886 A | | 3/2007 |
| JP | 2007253156 A | | 10/2007 |
| JP | 2007260773 A | | 10/2007 |
| JP | 2007319921 A | | 12/2007 |
| JP | 2007324326 A | | 12/2007 |
| WO | 03072521 A2 | | 9/2003 |
| WO | 2004-083133 A2 | | 9/2004 |
| WO | WO-2005/046926 A1 | * | 5/2005 |
| WO | WO2008035770 A1 | | 3/2008 |

OTHER PUBLICATIONS

V.A. Kagan et al, Advantages of Clearweld Technology for Polyamides, Proceedings ICALEO Oct. 17, 2002, paper #1404.

P. Herman et al., "Laser micromachining of 'transparent' fused silica with 1-ps. pulses and pulse trains", SPIE Vo. 3616, 0277-786X/99; Feb. 16, 2011.

Schaffer et al, "Bulk Heating of Transparent Materials Using a High-Repetition Rate Femtosecond Laser", Applied Physics A vol. 76, pp. 351-354, Dec. 2003.

T. Klotzbuecher, et al, "Microclear—A novel Method for Diode Laser Welding of Transparent Micro Structured Polymer Chips", Proceedings of the 23rd International Congress on Applications of Lasers and Electro-Optics, Oct. 2004, Paper # M504.

H.J. Herfurth, et al., "Joining Challenges in the Packaging of Biomems" Proceedings of the 23rd International Congress on Applications of Lasers and Electro-Optics, Oct. 2004 paper # M508.

Japanese Notification of Reasons for Refusal dated Nov. 7, 2012 issued in Japaense Patent Application No. 2008-075075.

Takayuki Tamaki et al, "Welding of Transparent Materials Using Femtosecond Laser Pulses", Japanese Journal of Applied Physics, vol. 44, No. 22, May 2005, pp. L687-L689.

Notice of reason for refusal dated Mar. 28, 2013 (with translation), JP2006-241654.

M. Sarkar et al, "Theoretical Analysis of Focusing and Intensity Mechanisms for a Spot Bonding Processing Using Femtosecond Laser", ASME International Mechanical Engineering Congress, Nov. 15-21, 2003, pp. 1-5.

Japanese Office Action, issued Jan. 27, 2016, Pat Appln No. 2013-191702.

Japanese Office Action, issued Jan. 26, 2016, Pat Appln No. 2014-258750.

Thomas Klotzbuecher, et al, "Microclear—A novel Method for Diode Laser Welding of Transparent Micro Structured Polymer Chips", Proceedings of the 23rd International Congress on Applications of Lasers and Electro-Optics, Oct. 4, 2004, eight pages, unnumbered.

* cited by examiner

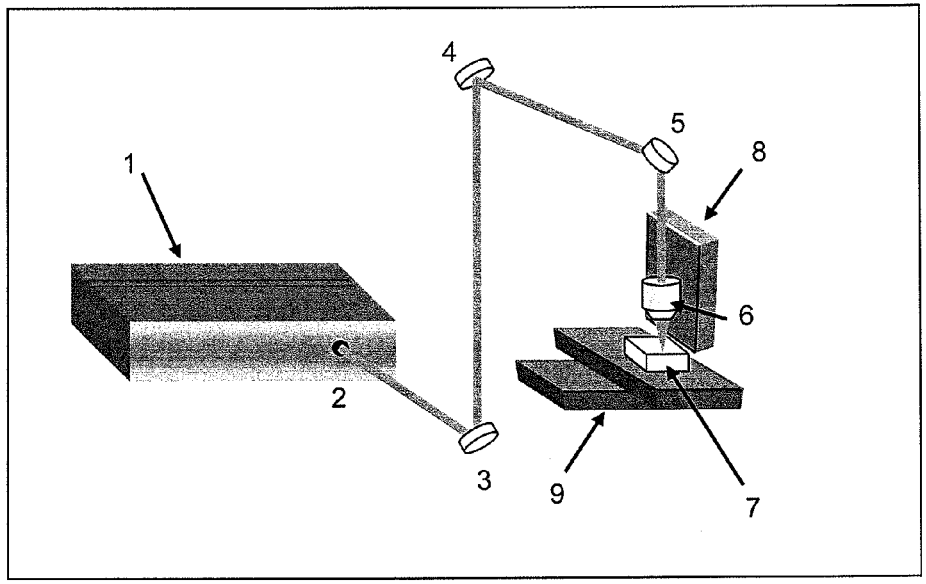
Fig. 1a
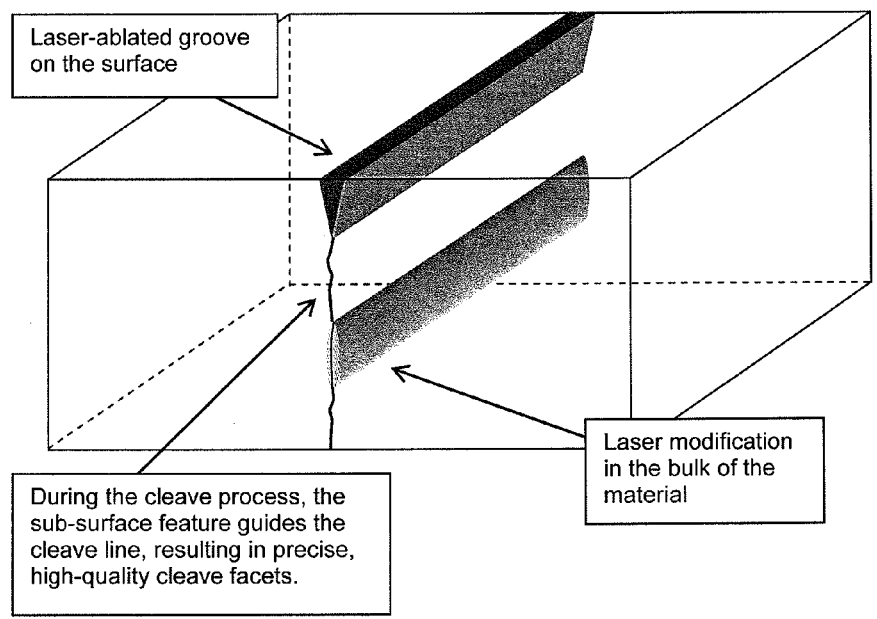
Fig. 1b, Diagram illustrating cleave-guiding by bulk modified region.

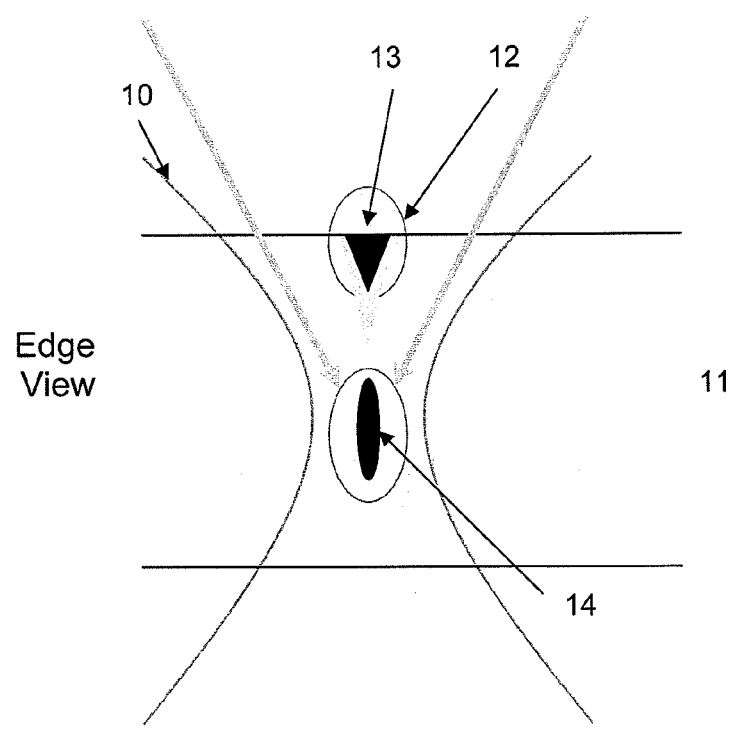
Fig. 2, Diagram showing how surface and bulk scribe features are generated for the case of a focused Gaussian beam with the beam waist projected below the surface.

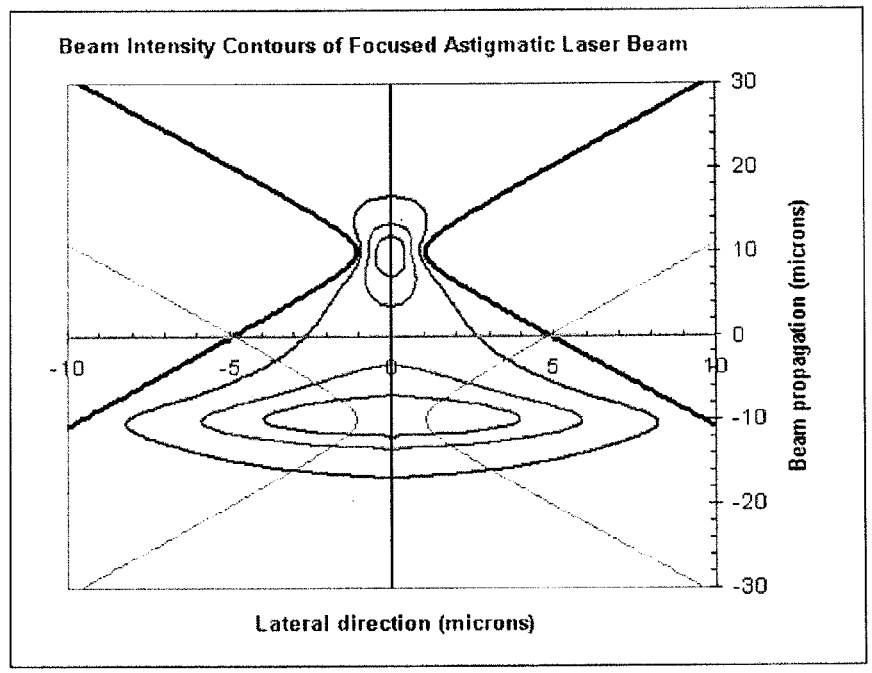
Fig. 4
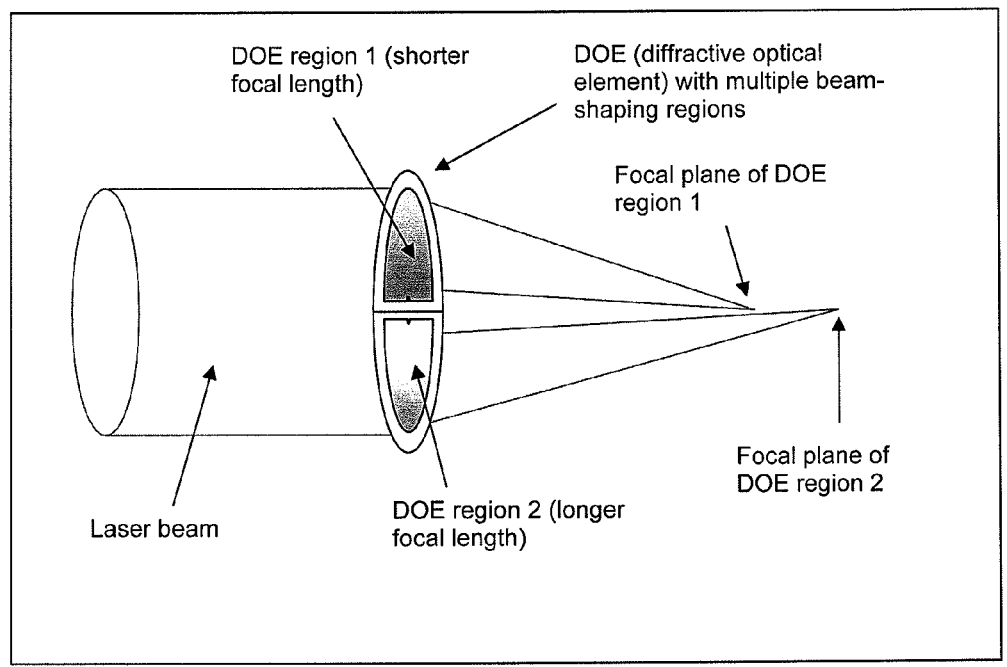
Fig. 5, Schematic showing how a DOE can be used to generate multiple intense regions for multiple scribe generation.

(a)                          (b)

TRANSPARENT MATERIAL PROCESSING WITH AN ULTRASHORT PULSE LASER

CROSS-REFERENCE TO RELATED APPLICATION

This application is a continuation of U.S. application Ser. No. 12/571,598 filed Oct. 1, 2009, now issued as U.S. Pat. No. 8,530,786 on Sep. 10, 2013, which is a continuation of U.S. application Ser. No. 11/517,325 filed Sep. 8, 2006, now issued as U.S. Pat. No. 7,626,138 on Dec. 1, 2009, which claims benefit of Provisional Application No. 60/714,863 filed Sep. 8, 2005, the disclosures of which are incorporated herein by reference in their entirety.

BACKGROUND OF THE INVENTION

1. Field of the Invention

This invention relates to ultrashort pulse laser processing of optically transparent materials, including material scribing, welding and marking.

2. Description of the Related Art

A. Cutting and Scribing

Cutting of optically transparent materials is often done with mechanical methods. Perhaps the most common method for cutting thin, flat materials is using a mechanical dicing saw. This is the standard method in the microelectronics industry for dicing silicon wafers. However, this method generates significant debris that must be managed in order to avoid parts contamination, resulting in increased overall cost of the process. In addition, the thinner wafers being used for advanced microprocessor designs tend to shatter when cut with a dicing saw.

To address these problems, current state-of-the-art processes for "scribe and cleave" material cutting use various types of lasers to scribe a surface groove on the material prior to breaking the material along this scribe. For example, a sub-picosecond laser pulses have been used to cut silicon and other semiconductor materials (H. Sawada, "Substrate cutting method," U.S. Pat. No. 6,770,544). Also, a focused astigmatic laser beam has been used to make a single surface groove for material cutting (J. P. Sercel, "System and method for cutting using a variable astigmatic focal beam spot," U.S. Patent Application No. 20040228004). This patent claims that by optimizing the astigmatic focusing geometry, increased processing speeds can be achieved.

To achieve a precise, high quality cleave, the groove must be of a certain minimum depth, the value of which varies by application (for example, 100-µm thick sapphire requires an approximately 15-µm deep groove for acceptable cleaving). Because the depth of the groove decreases as the scanning speed increases, the minimum depth requirement limits the maximum scanning speed, and hence the overall throughput, of a laser-scribing system. Alternative technology for material cutting uses multiphoton absorption to form a single laser-modified line feature within the bulk of a transparent target material (F. Fukuyo et al., "Laser processing method and laser processing apparatus," U.S. Patent Application No. 20050173387). As in the case of a surface groove, there is a particular minimum size of this sub-surface feature that is required in order to yield precise, high quality cleaving of the material, which equates to a limit on the processing speed for material cutting.

A noteworthy application of "scribe and cleave" material cutting is wafer dicing for separation of individual electronic and/or optoelectronic devices. For example, sapphire wafer dicing is used in singulation of blue light emitting diodes. Wafer singulation can be accomplished with backside laser ablation, minimizing contamination of devices on the front side of the wafer (T. P. Glenn et al., "Method of singulation using laser cutting," U.S. Pat. No. 6,399,463). Also, an assist gas can be used to aid a laser beam that dices a substrate (K. Imoto et al., "Method and apparatus for dicing a substrate," U.S. Pat. No. 5,916,460). In addition, a wafer can be diced by first using a laser to scribe a surface groove, and then using a mechanical saw blade to complete the cutting (N. C. Peng et al., "Wafer dicing device and method," U.S. Pat. No. 6,737,606). Such applications are generally executed in large volume and hence processing speed is of particular importance.

One process uses two different types of lasers, one of which scribes the material, and the other of which breaks the material (J. J. Xuan et al., "Combined laser-scribing and laser-breaking for shaping of brittle substrates," U.S. Pat. No. 6,744,009). A similar process uses a first laser beam to generate a surface scribe line, and a second laser beam to crack a non-metallic material into separate pieces (D. Choo et al., "Method and apparatus for cutting a non-metallic substrate using a laser beam," U.S. Pat. No. 6,653,210). Two different laser beams for scribing and cracking have also been used to cut a glass plate (K. You, "Apparatus for cutting glass plate," International Patent Application No. WO 2004083133). Finally, a single laser beam has been used to scribe and crack a material by focusing the laser beam near the top surface of the material and moving the focus down through the material to near the bottom surface while providing relative lateral motion between the focused laser beam and the target material (J. J. Xuan et al., "Method for laser-scribing brittle substrates and apparatus therefor," U.S. Pat. No. 6,787,732).

B. Material Joining

The joining of two or more optically transparent materials, such as glasses and plastics, is useful for applications in various industries. The construction of any type of device in which optical transparency allows or supplements functionality, or otherwise results in additional value (e.g. aesthetic), could benefit from such a joining process. One example is hermetic sealing of components where visual inspection is needed (e.g. telecommunications and biomedical industries).

In some applications, conventional joining processes (e.g. adhesives, mechanical joining) are inadequate. For example, many adhesives might prove non-biocompatible in the case of biomedical implant devices. For other devices, the adhesion simply may not be strong enough for the particular application (e.g. high-pressure seals). For such demands, laser welding offers an ideal solution.

In microfluidic systems, the sealing of individual, closely spaced paths relative to each other with a cap piece that covers the entire device would be desirable. Strong, tightly sealing joints can be difficult to make with other methods due to the small contact region between the different microfluidic paths. Laser welding can precisely position the bonded regions between these microfluidic paths and provide a tight seal.

The current state-of-the-art technology for laser welding of transparent materials consists of:

(1) use of a $CO_2$ laser, the wavelength (~10 µm) of which is linearly absorbed by many optically-transparent materials, or (2) introduction of an additional material at the interface of the transparent materials, which is specially designed to absorb the laser radiation, thereby causing heating, melting, and fusing of the materials.

Both of these methods are limited in their functionality and/or costly in their implementation.

A pulsed $CO_2$ slab laser has been used to weld Pyrex to Pyrex, and to bond polyimide and polyurethane to titanium and stainless steel (H. J. Herfurth et al., "Joining Challenges in the Packaging of BioMEMS," Proceedings of ICALEO 2004). Also, fused quartz and other refractory materials have been welded with a 10.6 µm $CO_2$ laser (M. S. Piltch et al., "Laser welding of fused quartz," U.S. Pat. No. 6,576,863). The use of such $CO_2$ lasers does not allow welding by focusing the beam through a thick top layer material, since the laser radiation is absorbed before it can reach the interface. An additional disadvantage is that the large wavelength does not allow focusing the beam to a small spot, thereby limiting its usefulness for creating small weld features on micron scales.

Alternatively an absorbing layer that is transparent to the human eye can be placed between two materials to be welded, such as polyamide and acrylic (V. A. Kagan et al., "Advantages of Clearweld Technology for Polyamides," Proceedings ICALEO 2002). A diode laser with line focusing is then used for welding (T. Klotzbuecher et al., "Microclear—A Novel Method for Diode Laser Welding of Transparent Micro Structured Polymer Chips," Proceedings of ICALEO 2004). The dye layer is specially designed to absorb the laser's wavelength (R. A. Sallavanti et al., "Visibly transparent dyes for through-transmission laser welding," U.S. Pat. No. 6,656,315).

One welding process for bonding glass to glass or metal employs a laser beam to melt a glass solder between the surfaces to be welded (M. Klockhaus et al., "Method for welding the surfaces of materials," U.S. Pat. No. 6,501,044). Also, two fibers can be welded together by using an intermediary layer that is linearly absorbent to the laser wavelength (M. K. Goldstein, "Photon welding optical fiber with ultra violet (UV) and visible source," U.S. Pat. No. 6,663,297). Similarly, a fiber with a plastic jacket can be laser-welded to a plastic ferrule by inserting an absorbing intermediary layer (K. M. Pregitzer, "Method of attaching a fiber optic connector," U.S. Pat. No. 6,804,439).

The use of an additional layer of an absorbing material has significant drawbacks. The most obvious is the cost of purchasing or fabricating a material that is appropriate for the process. A potentially more costly issue is the increase in processing time associated with incorporating this additional material into the manufacturing process. Such costs would be expected to rise dramatically as the size of the desired weld region becomes increasingly small, as would be the case with biomedical implant devices. Another disadvantage of using an intermediate, light-absorbing layer is that this layer may introduce contaminants into the area to be sealed. In the case of a microfluidic system, the light-absorbing layer would be in direct contact with the fluid flowing through the channel.

One method for welding a transparent material to an absorbing material is called through-transmission welding. In this method a laser beam is focused through a transparent material and onto an absorbing material, resulting in welding of the two materials (W. P. Barnes, "Low expansion laser welding arrangement," U.S. Pat. No. 4,424,435). This method has been used to weld plastics by directing polychromatic radiation through a top transparent layer and focusing the radiation onto a bottom absorbing layer (R. A. Grimm, "Plastic joining method," U.S. Pat. No. 5,840,147; R. A. Grimm, "Joining method," U.S. Pat. No. 5,843,265). In another example of this method, a black molded material that is transparent to the laser wavelength is welded to an adjacent material or via an added welding assist material that absorbs the laser wavelength (F. Reil, "Thermoplastic molding composition and its use for laser welding," U.S. Pat. No. 6,759,458). Similarly, another method uses at least two diode lasers in conjunction with a projection mask to weld two materials, at least one of which is absorbent of the laser wavelength (J. Chen et al., "Method and a device for heating at least two elements by means of laser beams of high energy density," U.S. Pat. No. 6,417,481).

Another laser welding method performs successive scans of a laser beam over the interface between two materials to incrementally heat the materials until melting and welding occurs (J. Korte, "Method and apparatus for welding," U.S. Pat. No. 6,444,946). In this patent one material is transparent, while the other material is absorbent to the laser wavelength. Finally, one method uses ultraviolet, laser, X-ray, and synchrotron radiation to melt two pieces of material, and then brings them into contact in order to form a weld (A. Neyer et al., "Method for linking two plastic work pieces without using foreign matter," U.S. Pat. No. 6,838,156).

Laser welding is disclosed for hermetic sealing of organic light emitting diodes where there is at least one layer of organic material between two substrates ("Method of fabrication of hermitically sealed glass package", U.S. Patent Application Publication 20050199599).

Tamaki et al. discuss the use of 130-fs laser pulses at 1 kHz to bond transparent material in "Welding of Transparent Materials Using Femtosecond Laser Pulses", Japanese Journal of Applied Physics, Vol. 44, No. 22, 2005. However, the material interaction of low repetition rate ultrashort pulses (kHz) is known to be distinctly different compared to high repetition rate ultrashort pulses (MHz) due to electron-phonon coupling time constants and accumulation effects.

C. Sub-Surface Marking

The patterning of sub-surface marks in glass has been adapted by artists to create 2-D portraits and 3-D sculptural works. These marks are designed to be strongly visible under a wide range of conditions without requiring external illumination.

Tightly focusing energy below the surface of optically transparent materials can produce visible, radially propagating micro-cracks. Long-pulse lasers are commonly used to create these marks. Several patents discuss variation of the size and density of these radial cracks to control the visibility of the subsequent pattern (U.S. Pat. Nos. 6,333,486, 6,734,389, 6,509,548, 7,060,933).

The visibility of the mark can be controlled by the crack density around the central laser spot, rather than just the size of the mark (U.S. Pat. No. 6,417,485, "Method and laser system controlling breakdown process development and space structure of laser radiation for production of high quality laser-induced damage images").

U.S. Pat. No. 6,426,480 ("Method and laser system for production of high quality single-layer laser-induced damage portraits inside transparent material") uses a single layer of smooth marks where brightness is controlled by the spot density.

Increasing the pulse duration of the writing laser light will increase the brightness of the mark (U.S. Pat. No. 6,720,521, "A method for generating an area of laser-induced damage inside a transparent material by controlling a special structure of a laser irradiation").

SUMMARY OF THE INVENTION

Through nonlinear absorption, ultrashort laser pulses can deposit energy into an extremely well-defined region within the bulk of a transparent material. Matching the laser properties and processing conditions can produce a range of features, changes in the index of refraction that enable optical waveguiding, melting and subsequent bonding at an internal interface, or the formation of an optical defect that scatters light.

The high repetition rate of the laser and significant pulse-to-pulse overlap results in an additional interaction between the material modification created by the previous laser exposure and the subsequent pulses in the same region. The light diffracts around the pre-existing modification and, through constructive interference, creates another spot in the "shadow" of the previous modification, commonly known as the "spot of Arago" or the "Poisson spot". The size and intensity of the spot increases with distance, with the intensity asymptotically approaching the input laser intensity.

One object of this invention is to enable clean breaking of transparent materials at a higher speed compared to the conventional technique. This is achieved by using ultrashort laser pulses to create both a surface groove on the material and one or more laser-modified regions within the bulk of the material (or, alternatively, multiple sub-surface laser-modified features only), with only a single pass of the beam across the material. Because multiple scribe features are created simultaneously, located both on the surface and in the bulk of the material, or in the bulk of the material only, the success of the subsequent cleave is not necessarily dependent on surface groove depth.

During the cleaving process of a scribed material, the fracture begins at the surface scribe feature and propagates down through the material. If the surface groove is too shallow, the fracture will tend to wander, resulting in low quality cleave facets and poor cleave process precision. With the presence of additional scribe feature(s) within the bulk of the material, however, the fracture is guided through the material in the desired direction, resulting in higher cleaving precision and facet quality than would be expected for the case of a shallow surface scribe only.

If a sufficient portion of the bulk material is modified below the surface, the fracture can begin from a sub-surface modified region and propagate to adjacent modified regions through the bulk of the material, without the need of a surface scribe line. Minimizing the size of, or completely eliminating, the surface groove also reduces the debris produced by the process that can contaminate the processing environment or require more extensive post-process cleaning.

Another object of this invention is the generation of patterns of sub-surface defects in transparent materials by focusing ultrashort laser pulses below the surface. Slightly modifying the processing conditions relative to scribing can produce optical defects below the surface that scatter light. By controlling the characteristics and arrangement of these defects, these patterns can be made to be clearly visible when illuminated from the side, but difficult to see when there is no illumination. This feature of sub-surface marking can be utilized for indicator signs or lights for vehicles, warning signs or lights, or for adding value (e.g., artistically) to a simple glass, etc. This technique is distinct from known laser marking techniques which are designed in a way such that the defects produced in the material are always clearly visible.

In one embodiment of this invention, a pattern of optical defects are created at different depths within the transparent material. Having the marks at different depths prevents a "shadowing" effect where one mark blocks the illuminating light from hitting subsequent marks. This structure at the same time reduces the amount of scattering from ambient illumination sources which are not directional, enhancing the contrast between the on-off states. These defects can be discrete points or extended lines.

The small size and smoother profile of these defects makes them less visible when not illuminated. Also the substrate will be stronger and less susceptible to crack propagation due to thermal or mechanical stress, particularly with thin transparent materials. The small size also allows for more discrete writing positions per unit thickness, increasing the pattern resolution for a given thickness of transparent material.

There is a trade-off between the visibility of the mark when illuminated and the invisibility of the marks without illumination. This trade-off can be adjusted by controlling the illuminating light source intensity, the size and smoothness of the marks and the spacing between marks. The control parameters for the size of the marks include pulse duration, fluence, and repetition rate and wavelength of the laser, and depth and movement speed of the focus point within the material. It is important to note that these parameters need to be adjusted for transparent materials with different optical, thermal and mechanical properties.

The desired pattern can be made up of a collection of discrete pixels where each pixel is a collection of parallel lines. Utilizing pixels enables creation of an over-all larger icon with fewer lines with greater contrast in visibilities.

The sub-surface pattern can be illuminated by a properly focused light source. Focusing is important to efficiently illuminate the pattern and minimize stray light. This illuminating light can be delivered directly from the light source if the distance between the light source and the pattern is relatively short. If the distance is long, total internal reflection between the top and bottom surfaces of the transparent material can be used to guide the light.

Another alternative is to create optical waveguides in the transparent material to deliver the light. An advantage of optical waveguide delivery is that the path between the source and the pattern need not be straight and/or short. For optical waveguide delivery, the output end of the waveguide should be properly designed to illuminate the desired pattern.

Two patterns in the same region can be distinguished separately and controllably illuminated by two different light sources. The axis of the illumination source for the respective pattern is perpendicular to the marks which make up the pattern. In this way the maximum scattering (and maximum visibility) from a particular illumination source can be selected for only the designated pattern.

Another object of this invention is to enable bonding of two pieces of clear material using a high repetition rate femtosecond pulse laser with no supplemental bonding agent. Focusing a high repetition rate, ultrafast laser beam at the contact area of two transparent material pieces will create a bond by localized heating. The required repetition rate for sufficient heat accumulation depends on many different process variables, including pulse energy, beam focusing geometry, and the physical properties of the particular material(s) to be welded. A theoretical analysis of conditions affecting the femtosecond laser spot bonding process emphasizes the determination of optimal focusing conditions for the process (M. Sarkar et al., "Theoretical Analysis of Focusing and Intensity Mechanisms for a Spot Bonding Process Using Femtosecond Laser," IMECE2003-41906; 2003 ASME International Mechanical Engineering Congress, November 2003, Washington, D.C., USA).

Due to nonlinear absorption of the laser radiation (caused by the ultrashort pulse duration), and the pulse-to-pulse accumulation of heat within the materials (caused by the high repetition rate), welding of transparent materials can be achieved with a degree of simplicity, flexibility, and effectiveness that is unparalleled in existing alternative methods. The nonlinear absorption process allows for concentration of the absorbed energy near the weld interface, which minimizes damage, and therefore optical distortion, to the rest of the material. Fine weld lines are possible when dense channels need to be separated.

Further, an embodiment of the current invention enables the joining by laser of two materials that are transparent to the wavelength of the laser radiation by directing the focal region of a beam of high-repetition rate, ultrashort pulses near to the interface of the materials to be joined. The laser pulse repetition rate is between about 10 kHz and 50 MHz and the laser pulse duration is between about 50 fs and 500 ps. The laser pulse energy and beam focusing optics are chosen so as to generate an energy fluence (energy per unit area) of more than about 0.01 $J/cm^2$ at the region to be welded.

The optimal range of fluence for welding depends on the particular materials to be welded. For transparent polymers (polycarbonate, PMMA (polymethylmethacrylate), etc.), the required fluence is less than that for glasses. This is due to the widely different physical properties of the materials. For example, the melting temperature of PMMA is ~150 degrees Celsius, while that for fused silica is ~1585 degrees Celsius. Therefore, significantly more laser fluence is required to melt fused silica. Other important material properties include the heat capacity and the thermal conductivity. The range of fluence for welding of polymers is between about 0.01 and 10.0 $J/cm^2$, while the corresponding range for welding glasses is between about 1.0 and 100 $J/cm^2$.

In general, welding requires that the two surfaces to be joined have virtually no gap between them. An object of this invention is the formation of a raised ridge at the interface between the two pieces to be bonded, that bridges any gap between them. By focusing high repetition rate fs pulses slightly below the surface, heating, melting, and pressure can result in localized raising of the surface of the glass. These bumps are 10's of nm to a few μm high. Where the energy deposited is not sufficient to cause the raised ridge to bond to the mating piece, a second pass of the laser at a slightly higher focus position will then weld the ridge to the mating piece. If a single ridge is not tall enough to bridge the gap, a second ridge on the upper mating surface can be created.

In addition, welding of materials with varying degrees of linear absorption can be achieved with this invention. While this invention uses nonlinear absorption phenomena as the primary means to couple energy to the material, it is appreciated that materials exhibiting some amount of linear absorption of the irradiating laser pulses can also be welded using methods presented herein. The significant aspect of linear absorption as it relates to this invention is that for higher linear absorption, the thickness of the material through which the beam can be focused decreases. Furthermore, higher linear absorption decreases the degree of localization of the weld feature.

The spatial distribution of the laser fluence can also affect the weld quality. While typical laser processing involves focusing a Gaussian laser beam to produce a smaller Gaussian laser beam, novel beam-shaping methods may be used in order to improve upon the quality and/or efficiency of a particular welding process. For example, transforming the typical Gaussian fluence distribution into a spatially uniform fluence distribution (known as a "flat-top" or "top-hat" intensity distribution) may result in more uniform weld features.

The ultrashort nature of the pulses allows for coupling of the laser energy into the transparent material via nonlinear absorption processes; however, this alone does not allow for laser welding, as this process does not generally result in heating of the material. It is the additional aspect of a high pulse repetition rate, combined with a particular range of other processing conditions, that allows for accumulation of heat within the materials so that melting, and subsequent cooling and joining, of the materials can be achieved.

Due to the absence of a supplemental bonding agent, processing time and expense are reduced, contamination inside the device due to excess bonding agent is eliminated, and fine dimensional tolerances can be maintained. Bond points and lines can be very close to other features without causing any interference. Also, very limited thermal distortion of material adjacent to the weld area is possible due to the concentrated fluence at the focal volume and the nonlinear absorption process.

BRIEF DESCRIPTION OF THE DRAWINGS

The invention will be more clearly understood from the following description in conjunction with the accompanying drawings, wherein:

FIGS. 1(a) and (b) are diagrams of a system used in a method for scribing transparent materials according to one embodiment of the current invention, where FIG. 1(a) shows the system configuration, and FIG. 1(b) shows a detail view of the scribing and subsequent cleaving;

FIG. 2 is an illustration of the surface and bulk scribe features that are generated by a focused Gaussian beam according to one embodiment of the current invention;

FIG. 4 is an intensity contour plot of a focused Gaussian astigmatic beam used in one embodiment of the current invention;

FIG. 5 is an illustration of a diffractive optical element (DOE) used in one embodiment of the current invention;

FIG. 6(a) shows the system schematic.

FIG. 7 are illustrations of the welding process where a raised ridge is used to fill the gap between two pieces. FIG. 7 (a) shows the gap.

FIG. 12(a) shows the fused silica before breaking apart the weld, FIG. 12(b) shows the bottom surface of the fused silica after breaking apart the weld, and FIG. 12(c) shows the top surface of the fused silica after breaking apart the weld.

DETAILED DESCRIPTION OF THE PREFERRED EMBODIMENTS

1. Ultrashort Pulse Laser Scribing

Figure 3:
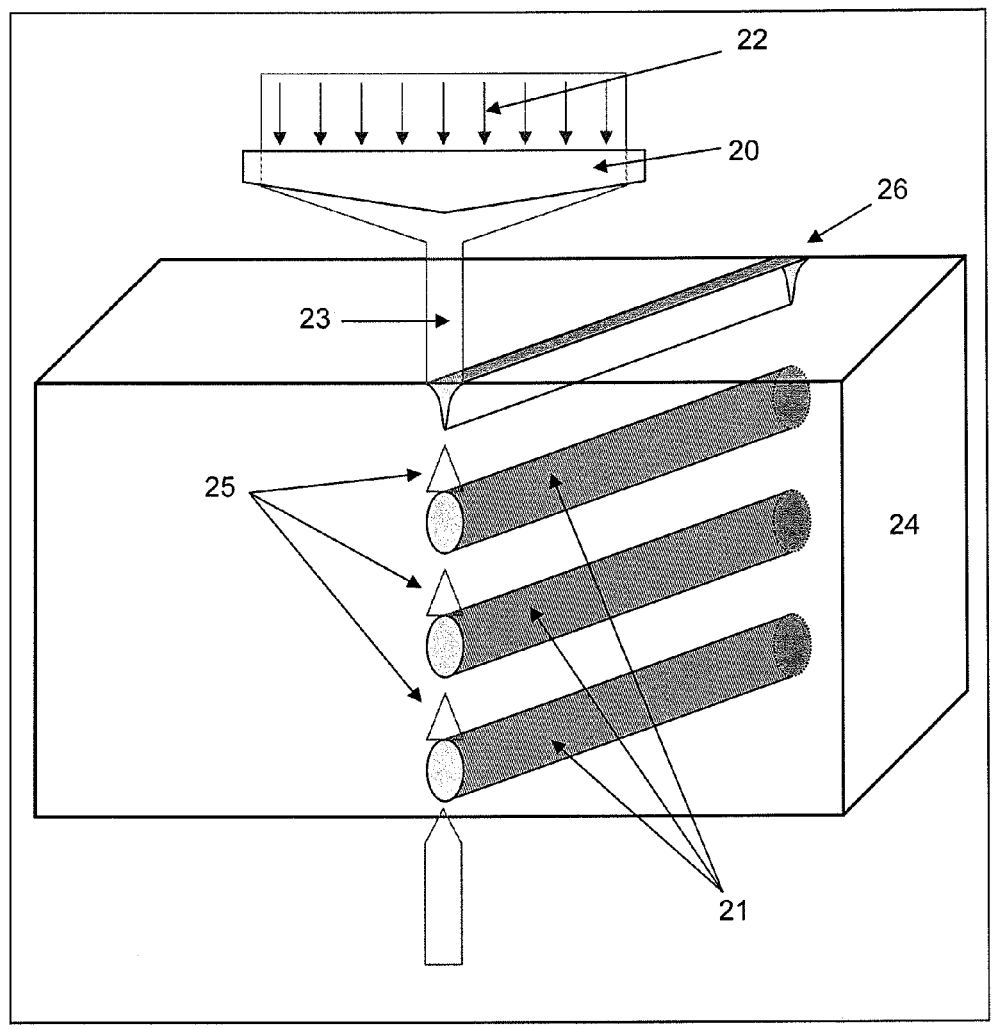
FIG. 3 is a diagram of a system that uses an axicon lens to generate multiple sub-surface scribe lines according to one embodiment of the current invention.

FIG. 1 illustrates one embodiment of the current invention, which is a method for scribing transparent materials for subsequent cleaving. This embodiment employs a laser system (1) producing a beam of ultrashort laser pulses (2), an optical system (6) that generates a desired laser beam intensity distribution, and a target material (7) to be scribed that is transparent to the wavelength of the laser pulses. In addition, a Z-axis stage (8) is used for beam focus position control (depth), and an automated X-Y axis stage assembly (9) is generally required for moving the work pieces (7) laterally relative to the focused laser beam. Alternatively, the laser beam (2) could be moved relative to a stationary target material with the use of scanning mirrors (3), (4), and (5).

The laser beam (2) is directed through the optical system (6), which transforms the laser beam (2) to create a desired 3-dimensional intensity distribution. Particular regions of the transformed laser beam have sufficient intensity to cause ablation and/or modification of the target material via nonlinear absorption processes. Material ablation generally refers to the vaporization of material from intense laser radiation. Material modification more broadly refers to a change in the physical and/or chemical structure of the irradiated material, which can affect the propagation of a crack through the material. Laser modification generally requires lower optical intensities than laser ablation for a particular material.

The transformed beam is directed toward the target transparent material (7) to cause ablation/modification of the material (7) at multiple determined locations, within and/or on the surface, of the material (7). The ablated and/or modified regions are generally located in the material (7) along the optical propagation axis and are separated within the material (7) by a determined distance. The transformed beam and the target material (7) are moved relative to each other, resulting in the simultaneous generation of multiple laser-scribe features in the material (7). The multiple scribe features allow for cleaving of the material (7) with the application of suitable force(s) (See FIG. 1(b)).

FIG. 2 illustrates another embodiment of the current invention, in which a laser beam (10) having a Gaussian spatial intensity distribution is focused to create sufficient intensity for nonlinear absorption and subsequent ablation or modification of the target material (11). The region of tightest focus is positioned below the material's surface to a chosen location within the bulk of the material (11). In addition, by employing suitable focusing optics and laser pulse energy, a region of intensity sufficient to cause material ablation is at the same time generated on or near the surface of the material (11).

The important aspect is that the pulse energy and focusing geometry are chosen such that there is sufficient intensity to simultaneously cause ablation or modification not only within the bulk of the material (where the focused beam waist is positioned), but also at another point on the optical propagation axis prior to the beam waist (12) (either in the bulk or on the surface of the material). When the laser pulses encounter the target material (11), their high-intensity region (near the center of the radial Gaussian intensity distribution) is absorbed nonlinearly by the material and ablation or modification occurs. The outer spatial regions of the laser beam (outer edges of the Gaussian intensity distribution), however, are too low in intensity to be absorbed by the material, and continue to propagate to the beam waist, located further within the bulk of the material. At the beam waist location, the beam diameter is small enough to once again generate sufficient intensity for nonlinear absorption and subsequent laser modification to occur in the bulk of the material.

A region directly below the surface ablation may also be modified by diffraction and constructive interference of succeeding pulses after the initial surface feature is created (spot of Arago). A relatively high repetition rate laser source better enables this process at reasonable translation speeds.

Under these focusing and pulse energy conditions, translation of the material (11) relative to the laser beam (10) results in the simultaneous generation of multiple laser-modified regions (i.e. a surface groove (13) and one or more bulk modified regions (14), or two or more bulk modified regions), which together allow for precise cleaving of the material.

FIG. 3 illustrates another embodiment of the current invention, in which an axicon (cone-shaped) lens (20) is used to generate the multiple internal scribe lines (21). When illuminated with a laser beam (22), the axicon lens (20) creates what is known as a 0th-order Bessel beam. The name arises from the fact that the mathematical description of the optical intensity distribution in the plane normal to the axis of propagation is defined by the 0th-order Bessel function, with the radial position from the beam center being the independent variable. This beam has the unique property of containing a high-intensity central beam spot (23) that can propagate with the same small size for much larger distances than for the case of a similarly-sized beam spot generated by conventional focusing methods (i.e. much longer than the Rayleigh range of a conventionally-focused beam). The central intensity field is surrounded by a plurality of concentric rings of light (not shown), the intensity of which decreases with increasing radius. Due to an inward radial component of their propagation vector, these rings of light continually reconstruct the small, central beam spot (25) as the Bessel beam propagates. Therefore, a small, high intensity central beam spot (23) can be generated that maintains its small diameter through the entire thickness of a target material (24). Because of the extended range of tight beam focusing, the Bessel beam is also commonly referred to as a non-diffracting beam.

Because the outer rings reconstruct the intense center spot (23), if the center spot (23) is intense enough to cause ablation of the material at the surface (26), the rings (which have a larger diameter than the ablated region) will converge to the center of the beam a short distance later, causing reconstruction of the intense center beam spot, at which point ablation or material modification can occur again. With proper optical system design and sufficient pulse energy, this process of ablation and subsequent beam reconstruction can repeat through the entire bulk of the transparent material (24). Other optical components, such as graded-index lenses and diffractive optical elements, can also be used to generate Bessel beams.

In additional embodiments of this invention, alternative beam intensity transforming techniques, well known to those skilled in the art, are employed in the optical system of the invention to tailor the beam intensity to generate multiple scribe lines in the target material. One such method utilizes astigmatic beam focusing to create two distinct regions of high optical intensity, separated by a determined distance. FIG. 4 displays an intensity distribution plot of a focused astigmatic Gaussian beam, in which the focal planes of the X and Y axes are separated by a distance of 20 µm. Note the presence of two distinct high intensity regions (distinguished by the constant-intensity contour lines). When directed at the target material, these two regions can be used to create multiple laser scribe features.

Another method for generating multiple scribe features in a transparent material employs a diffractive optical element (DOE) that is designed to generate multiple regions of high optical intensity at different locations along the beam propagation axis. FIG. 5 illustrates how such a DOE could function. These multiple intense regions, when directed at the target material, generate multiple scribe features for subsequent cleaving of the material.

For a variety of beam-focusing and/or intensity-mapping methods used to generate multi-scribe ablation features, additional optical components could be introduced to generate an elliptical component to the overall beam shape. By orienting the elliptical beam such that the long axis is parallel to the direction of beam scanning, higher scanning speeds can be achieved. Higher scanning speeds can be achieved because the elliptical beam shape allows for sufficient pulse-to-pulse overlap for the machining of smooth and continuous scribe features (as opposed to dotted scribe features resulting from spatially-separated pulses ablating the material). While increased pulse overlap, and higher scanning speeds, could also be achieved with a larger circular beam spot, this would at the same time result in a wider scribe feature width, which is often undesirable.

2. Ultrashort Pulse Laser Welding

Figure 6A:
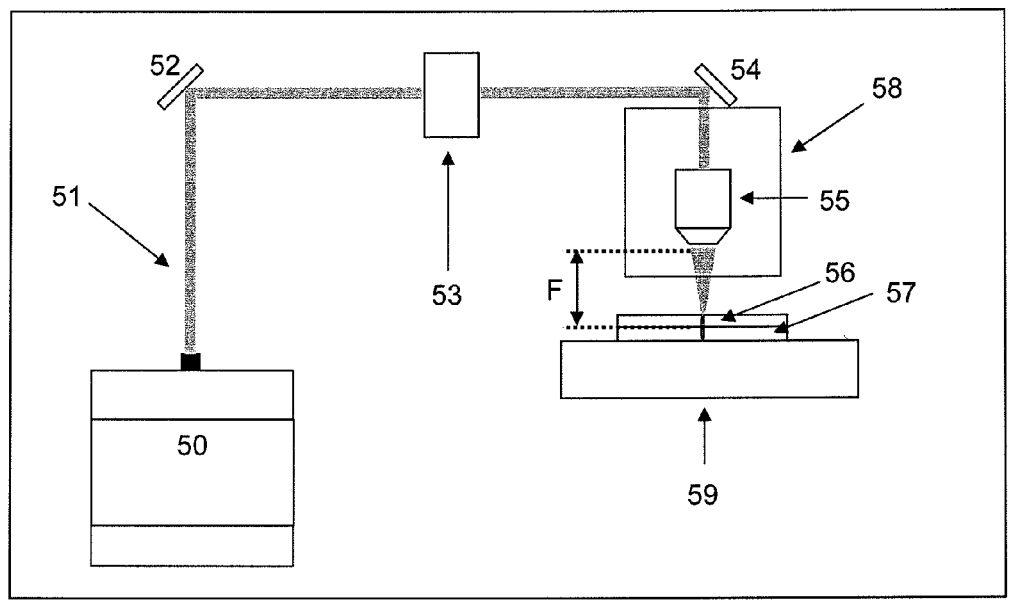
FIGS. 6(a) and (b) are diagrams of a system used in a method for welding transparent materials according to one embodiment of the current invention, where
Figure 6B:
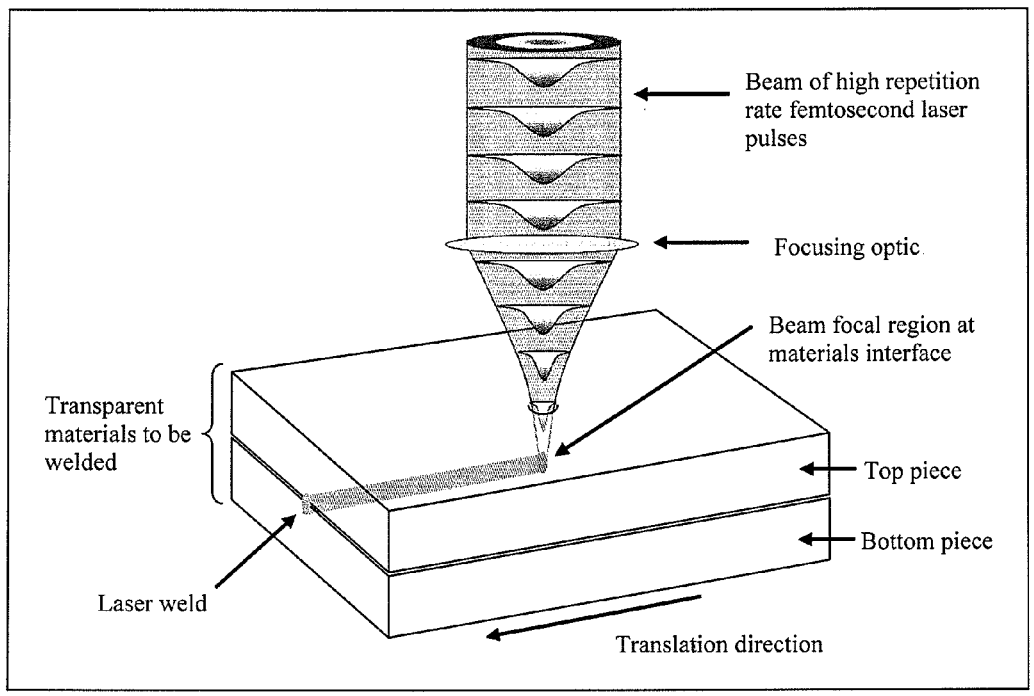
FIG. 6(b) is an enlarged view showing the detail of beam focusing within the adjoining materials.

Another embodiment of the current invention relates to a process for laser-welding of transparent materials. As shown in FIG. 6, this embodiment requires the use of a laser system (50) producing a beam of ultrashort laser pulses (51) at a high repetition rate; a focusing element (55) (e.g. lens, microscope objective) of sufficient focusing power; and at least two materials (56) and (57) to be joined together, at least one of which is transparent to the wavelength of the laser. In addition, a beam focus positioning stage (58) is used to adjust the focus position of the laser beam (51), and an automated motion stage assembly (59) is generally required for moving the work pieces (56) and (57) relative to the focused laser beam.

In this embodiment, the two materials ("top piece" (56) and "bottom piece" (57)) to be laser-welded are placed in contact with each other to create an interface with little or no gap between their surfaces; a clamping force may or may not be applied to the two pieces. A lens (55) is then positioned in the path of the laser beam to create a focal region of high intensity laser radiation. The two transparent materials (56) and (57) are positioned relative to the focused laser beam such that the beam focal region spans the interface of the top piece (56) and the bottom piece (57). With sufficient laser intensity, welding of the material interface will occur. By moving the transparent materials (56) and (57) relative to the beam focal region, while at the same time keeping the interface of the materials (56) and (57) in close proximity to the beam focal region, a determined length of laser welding can be achieved. In a particularly unique application of this embodiment, the materials (56) and (57) could be positioned such that the focused laser beam travels through the top (transparent) piece (56) and forms the focal region near to the interface of the top piece (56) and the bottom piece (57), resulting in welding of the two materials.

Unlike other laser welding processes, the process of the invention welds by utilizing primarily nonlinear absorption rather than linear absorption. Because of this, there are unique properties in this welding process. The nonlinear absorption is very intensity dependent so the process can be limited to the focus of the laser beam. Thus the absorption can be made to occur only deep within a transparent material around the focus. Typically nonlinear absorption by ultrashort pulses leads to plasma formation and very little (if any) heat deposition, thus ablation with ultrafast lasers leads to a very small heat affected zone (HAZ). However, by keeping the intensity low enough so ablation does not occur but high enough for nonlinear absorption to occur, some heat is deposited. If the repetition rate of the laser is increased sufficiently then the heat can be accumulated sufficiently in the material to lead to melting.

The laser system (50) emits an approximately collimated laser beam (51) of pulses having a pulse duration in the range of about 200-500 fs and a wavelength of about 1045 nm at a pulse repetition rate between 100 kHz and 5 MHz. The first beam steering mirror (52) directs the laser beam to the power adjust assembly (53), which is used to adjust the pulse energy that is used for the welding process; specific methods for achieving such attenuation are well known to those skilled in the art. The second beam-steering mirror (54) directs the beam onto the beam focusing objective (55). The beam focusing objective (55) focuses the laser pulses to achieve the appropriate fluence (energy/unit area) for the process, which has a maximal value at approximately a distance (F) from the beam focusing objective (55). The beam focus positioning stage (58) translates the beam-focusing objective (55) such that this maximal fluence region is located at the interface of the target materials (56) and (57). The XY stage assembly (59) moves the target materials (56) and (57) relative to the focused beam so as to provide for the ability to generate a linear weld feature, or an array of circular weld features, at the interface of the target materials (56) and (57).

Figures 7A, 7B, 7C:
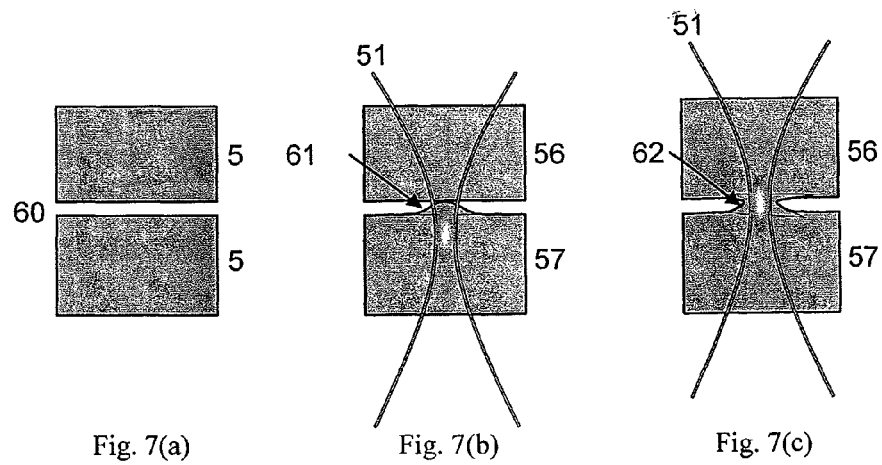
FIG. 7(b) shows the ridge formed by focusing the laser beam slightly below the surface of the lower piece.
FIG. 7(c) shows the weld formed when the laser focus is moved up to the interface between the raised ridge and the upper piece to be bonded.

FIG. 7 shows another embodiment of this invention where welding is desired between two pieces separated by a small gap (60). First, the laser beam (51) is focused below the surface of the bottom piece (57). With the proper control of the pulse energy and focusing conditions, a raised ridge (61) is formed as the sample is translated relative to the beam focus (or as the beam is moved relative to the target). This raised ridge (61) bridges the gap between the top and bottom targets. A second pass of the laser with the beam focus raised to the height near the interface between the top of the raised ridge (61) and the top piece (56) then forms the weld (62).

3. Visible/Invisible Laser Marks

Figure 8:
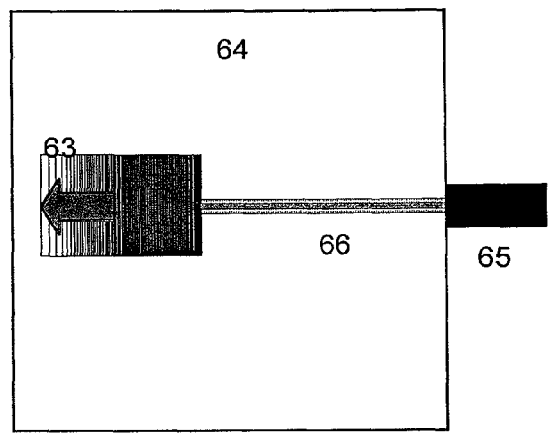
FIGS. 8, 9(a), 9(b) and 10 show illustrations of the sub-surface marking, wherein an arrow mark has been used as an example of the markings possible according to the invention.

The same system shown in FIG. 1a can be used to make sub-surface marks in transparent materials where the applied laser beam is focused below the surface of the transparent material substrate FIG. 8 shows an illustration of the top-view of an arrow pattern (63) written in a transparent material (64) such as glass. A light source (65) injects light into an optical waveguide (66) that delivers the light to the arrow mark (63) to illuminate the pattern. The output numerical aperture of the optical waveguide should be properly designed to efficiently illuminate the desired source. Multiple optical waveguides can be used to illuminate different regions of a pattern. Controlling the timing of the different illuminating light sources can produce different decorative and signaling effects. Alternatively, the pattern can be illuminated directly from a properly focused light source, rather than using an optical waveguide.

Figures 9A, 9B:
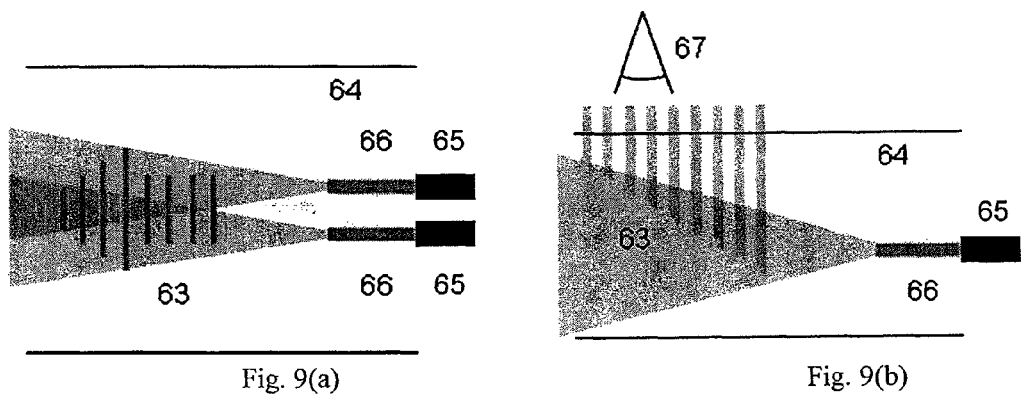

FIG. 9 (a) shows an illustration of a close-up of the top-view of the arrow mark (63) that is made up of parallel lines, all perpendicular to the direction of the illumination light. These parallel lines are generated by tightly focusing the laser light within the target substrate to create regions of material modification. FIG. 9 (b) shows an illustration of the side-view of the arrow mark (63). The arrow mark is composed of a group of marks at different depths. These marks scatter the light delivered by the optical waveguide (66) towards the viewer (67). The brightness can be controlled by the intensity of the illuminating light, the size of the individual marks and the density of the marks.

Figure 10:
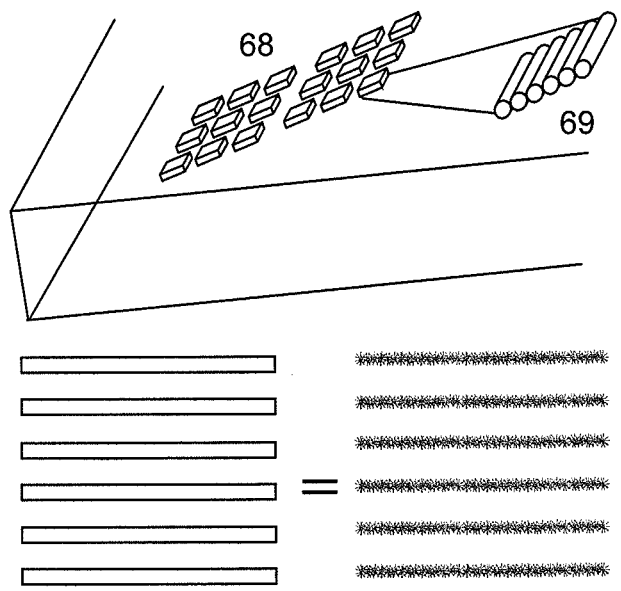

FIG. 10 shows an illustration of the concept where the pattern is composed of a "pixels" (68) and where each pixel is made up of a group of parallel lines at different depths (69) formed by tightly focusing the laser light to modify the substrate material.

Experimentally Demonstrated Results

1. Ultrashort Pulse Laser Scribing

Figure 11:
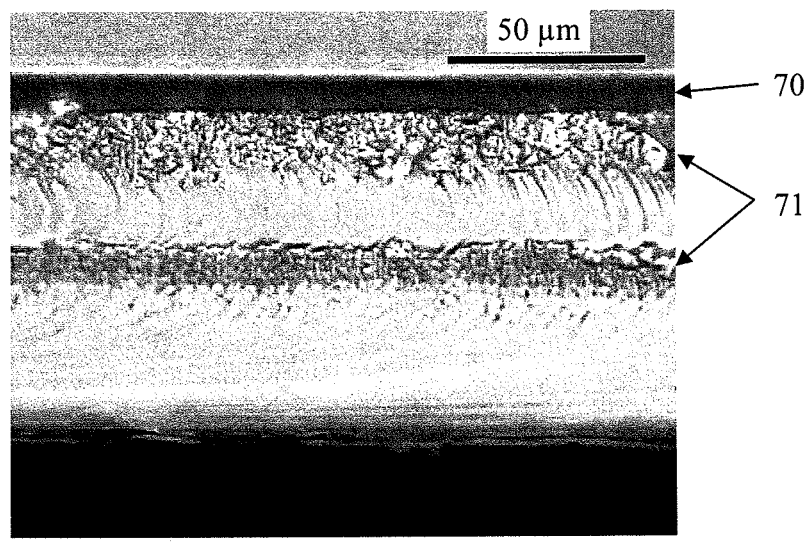
FIG. 11 is an optical micrograph showing experimental results of one embodiment of the current invention.

As shown in FIG. 11, with a single pass of the laser beam, a pair of scribe lines (a surface groove (70) and a sub-surface scribe feature (71)) were simultaneously machined in a 100-μm thick sapphire wafer using a 20× aspheric focusing objective (8-mm focal length). The cleave facet exhibits good quality. The scanning speed was 40 mm/s (not optimized).

For the case of a surface scribe line only, using the same laser pulse energy and repetition rate, and under identical processing conditions (ambient atmosphere environment, etc.), the fastest scribing speed which resulted in good cleaving of the material was ~20 mm/s.

2. Ultrashort Pulse Laser Welding

After a number of laser pulses are absorbed within a particular region of the materials to be welded, heating, melting and mixing of the materials occurs and, upon cooling, the separate materials are fused together. The number of pulses required to weld the materials together depends on other process variables (laser energy, pulse repetition rate, focusing geometry, etc.), as well as the physical properties of the materials. For example, materials with a combination of high thermal conductivity and high melting temperature require higher pulse repetition rates and lower translation speeds to achieve sufficient thermal accumulation within the irradiated volume for welding to occur.

A. Polycarbonate Welding

Experiments with a high-repetition rate, femtosecond pulse laser source operating at a pulse repetition rate of 200 kHz and having a wavelength of 1045 nm have resulted in the laser-joining of two optically-transparent materials. In particular, ~2 μJ laser pulses were focused with a 100 mm focal length lens through the top surface of a ¼"-thick piece of transparent polycarbonate, and onto its bottom surface interface with the top surface of a similarly-sized piece of transparent polycarbonate. The polycarbonate pieces were translated linearly and in a plane perpendicular to the direction of laser propagation, maintaining positioning of the beam focal region near-to the interface of the materials. The two pieces were fused together at the laser-irradiated interface and significant force was required to break them free from one another.

B. Fused Silica Welding

Figure 12:
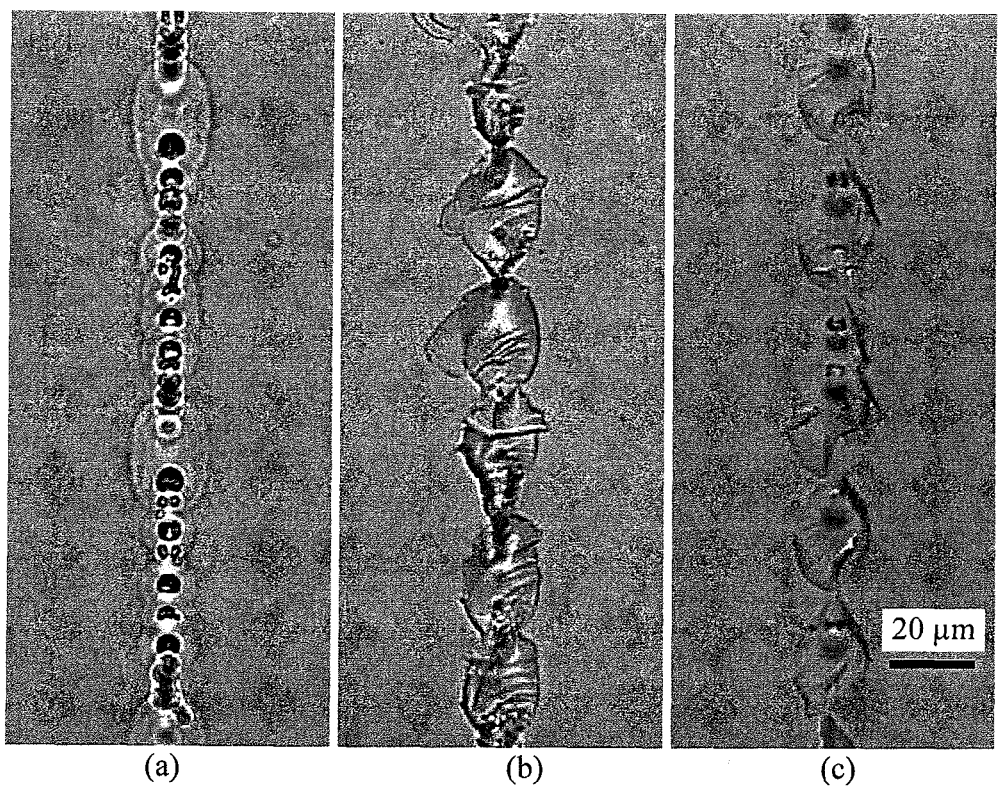
FIG. 12 are an image sequence showing a fused silica weld according to one embodiment of the current invention.

A 200-μm thick fused silica plate was welded to a 1-mm thick fused silica plate using a 40× aspheric lens and a laser repetition rate of 5 MHz. The $1/e^2$ beam diameter of the laser was ~3.6 mm and the aspheric lens focal length was 4.5 mm, resulting in an operating NA (numerical aperture) of ~0.37. FIG. 12 shows a weld feature in fused silica, with images taken both before and after breaking the two silica plates apart. The first image (a) shows the intact weld feature exhibiting regions of smooth melted glass, and the subsequent images (b) and (c) show the two glass surfaces after the weld was fractured, exhibiting facets of fractured glass.

Welding speeds ranged from 0.1 to 1.0 mm/s, though speeds greater than 5 mm/s are possible, and the maximum speed could be increased with an increased pulse repetition rate. The nominal fluence range for the process is 5-15 J/cm$^2$ and the nominal pulse duration range is 10-1000 fs. Within these fluence and pulse duration ranges, the nominal pulse repetition rate range is 1-50 MHz. With rigorous process optimization, these ranges may be extended to 1-100 J/cm$^2$, 1 fs-500 ps, and 100 kHz-100 MHz for the fluence, pulse duration, and repetition rate, respectively. The high repetition rate is required for sufficient thermal accumulation for the onset of melting in the fused silica.

With the availability of higher energy pulses at similar repetition rates, looser focusing is possible to generate a larger focal volume with the required fluence. The size and shape of this welding focal volume can be tailored based on the region to be welded.

3. Visible/Invisible Laser Marks

Figure 13:
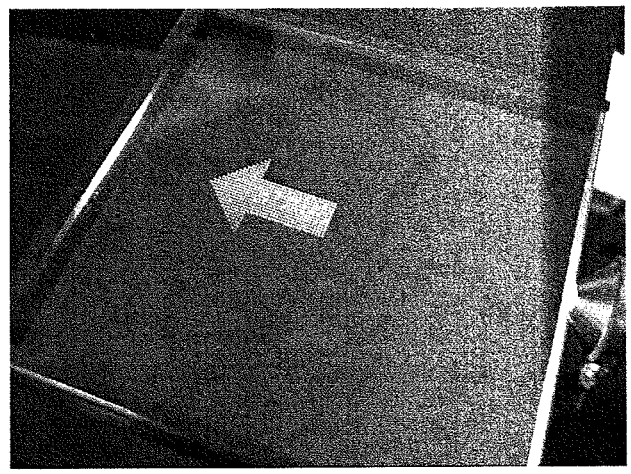
FIGS. 13, 14 and 15 are photos of a glass marked sample made according to the present invention; and, FIGS. 16a and 16b are photos of a prior art decorative article made by laser marking using a long-pulse laser, and an individual mark thereof.

FIG. 13 shows a glass sample with the arrow mark illuminated by a green light source from the side. Here, the arrow pattern is clearly visible. The illustrations in FIGS. 8 and 9 show the details of the arrow pattern, where lines at different depths, perpendicular to the illuminating light source (green light in this case) were generated by tightly focusing the laser light.

Figure 14:
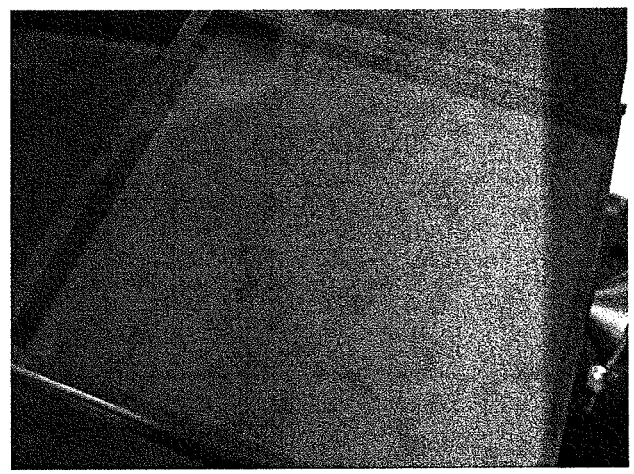

FIG. 14 shows the same glass sample with the illuminating light source off. Clearly, the arrow pattern cannot be seen.

Figure 15:
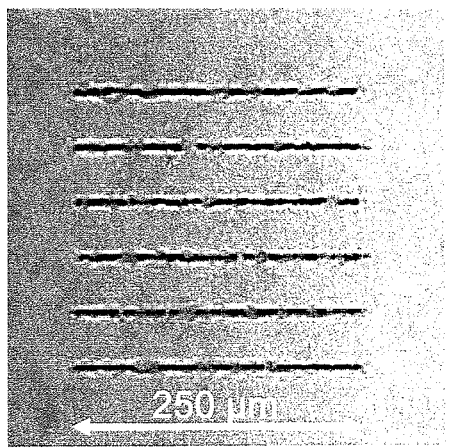
Figure 16:
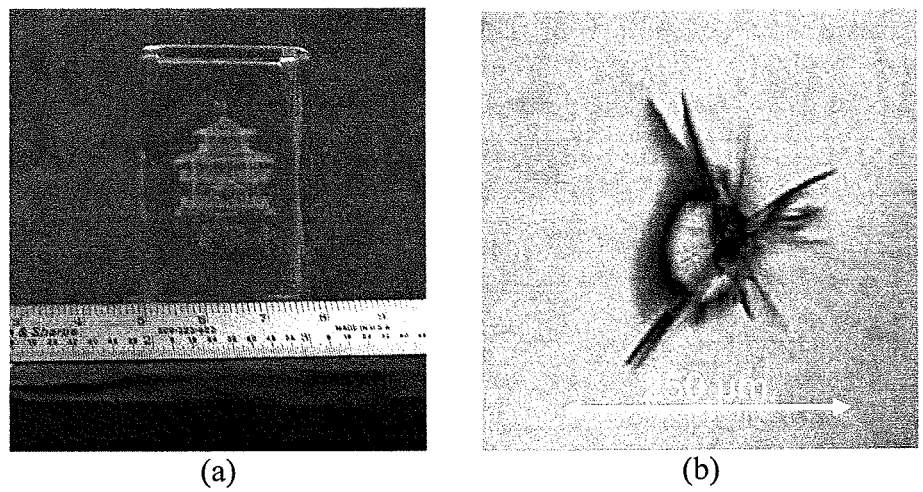

FIG. 15 shows a microscope photo of an individual pixel that is used to define the arrow mark in FIG. 13. FIG. 16 (a) shows a photo of a decorative pattern inside glass and FIG. 16 (b) shows a microscope image of an individual mark.

The mark in FIG. 16 (b) is approximately 200 μm in size and very rough, composed of several distinct cracks radiating from the center. The pixel in FIG. 15 is made up of a series of parallel lines, each line is roughly 10 μm wide and 250 μm long. The line spacing is 50 μm. The difference in size and smoothness difference between the features in FIGS. 15 and 16 (b) explains why the glass sculpture in FIG. 16 (a) is clearly visible in most lighting conditions while the arrow in FIGS. 13 and 14 requires side illumination to be visible. The size and smoothness of the generated feature is controlled by the pulse energy, pulse duration, wavelength of the laser and the translation speed of the beam through the target. The optimal parameters depend on the particular target material. The visibility of the pixel in FIG. 15 can be controlled by controlling the width and length of each line in the pixel and the line density within the pixel as well as the smoothness.

Thus, one method for generating visible patterns of laser-modified features below the surface of the transparent material proceeds by first forming a plurality of lines at different depths within the material using a tightly focused ultrafast pulse laser, while controlling the roughness of the lines by controlling parameters of said laser as described. The lines are then illuminated using light propagating or directed generally perpendicular to the lines. The patterns formed in this way are clearly visible to the unaided eye when illuminated from the perpendicular direction, although they are substantially invisible to the unaided eye when not illuminated; i.e., under normal ambient light conditions as in FIG. 14. The illumination is conducted by directing a focused light source upon the lines or by directing the light to the lines via an optical waveguide with an output numerical aperture selected to efficiently illuminate the pattern.

Different ones of said lines, for example the lines of different pixels, can be at defined angles relative to one another, and can be illuminated separately or simultaneously by arranging multiple light sources so that they each direct light generally perpendicular to a subset of said lines.

Thus, the invention provides a transparent material having patterns of sub-surface markings formed by a laser, e.g. an ultrafast pulse laser, where the markings are formed of lines at different depths within the material, with the lines being substantially visible to the unaided eye only when illuminated with a light source directed generally perpendicular to the lines.

What is claimed is:

1. A laser-based method for generating visible patterns of optical defects comprising marks formed below the surface of a transparent material, said patterns having controllable contrast and visibility, said method comprising:
    forming a plurality of marks at different depths within the material using tightly focused ultrashort pulsed laser outputs, said tightly focused outputs having controllably varied focal points and sufficient fluence so as to create regions of material modification at said different depths below said surface, such that marks at different depths are arranged in such a way as to prevent shadowing in which a first mark prevents directional illumination from impinging a second mark, and wherein said marks are sufficiently small and smooth to decrease visibility under ambient light while increasing pattern resolution;
    controlling the roughness of said patterns by controlling parameters of said laser; and
    illuminating said marks using directional illumination, wherein said patterns are clearly visible to the unaided eye when illuminated with said directional illumination, and substantially invisible to the unaided eye under ambient light when said illuminating is suspended.

2. The method as claimed in claim 1, wherein the illuminating is conducted by directing focused light upon said patterns.

3. The method as claimed in claim 1, wherein the illuminating is conducted by directing the light to said patterns via an optical waveguide with an output numerical aperture selected to efficiently illuminate the pattern.

4. The method as claimed in claim 1, wherein said marks comprise discrete points.

5. The method as claimed in claim 1, wherein said marks comprise extended lines.

6. The method as claimed in claim 1, wherein different ones of said patterns are at defined angles relative to one another, and said illuminating is performed by directing focused light to said patterns from plural sources.

7. The method as claimed in claim 6, wherein each one of said plural sources directs light in a direction generally perpendicular to a subset of said marks.

8. The method as claimed in claim 1, wherein said directional illumination comprises side illumination.

9. A laser-based system for generating visible patterns of optical defects comprising marks below the surface of a transparent material, said patterns having controllable contrast and visibility, said system comprising:
    an ultrashort pulse laser that generates optical pulses;
    an optical system for focusing laser pulses emitted from said laser into tightly focused spots below said surface;
    a positioning stage assembly for three-dimensional positioning of said substrate relative to said laser pulses,
    wherein said laser, optical system, and said positioning stage for three-dimensional positioning are operably arranged to controllably deliver said tightly focused spots to form optical defects comprising marks at different depths below said surface, such that said patterns are clearly visible to the unaided eye when illuminated with directional illumination, and substantially invisible to the unaided eye under ambient light when said directional illumination is suspended, and
    wherein said system forms marks with said tightly focused spots at different depths below said surface, and arranged in such a way as to prevent shadowing in which a first mark prevents directional illumination from impinging upon a second mark, and wherein said marks are sufficiently small and smooth to decrease visibility under ambient light while increasing pattern resolution.

10. The system of claim 9, wherein said system is controllable to produce signaling or decorative effects.

11. The system of claim 9, wherein said pulses are generated at a repetition rate in the range from about 100 kHz to about 5 MHz.

12. The system of claim 9, further comprising: an illuminator to provide directional lighting of one or both of said patterns or marks.

13. The system of claim 12, wherein said illuminator comprises an optical waveguide.

14. A transparent device having internal marks at different depths, at least a portion of said marks being arranged as continuous extended lines, with an elongated cross-sectional profile, in such a way as to prevent shadowing in which a first mark closer to a directional illumination source prevents the directional illumination from impinging upon a second mark, and wherein said marks are sufficiently small and smooth to decrease visibility under ambient light while increasing pattern resolution.

15. The device of claim 14, said continuous extended lines are material modifications resulting from impingement upon the material by tightly focused spatially overlapping ultrashort pulses generated at a high repetition rate.

* * * * *